Jan. 7, 1969 KIAMIL GIONTZENELI 3,421,100

DIRECT COUPLED AMPLIFIER INCLUDING TWO-STAGE AUTOMATIC GAIN CONTROL

Filed Nov. 10, 1966

INVENTOR
Kiamil Giontzeneli
By Eugene M. Whitacre
Attorney 3,421,100
Patented Jan. 7, 1969

1

2

3,421,100
DIRECT COUPLED AMPLIFIER INCLUDING TWO-STAGE AUTOMATIC GAIN CONTROL

Kiamil Giontzeneli, Somerville, N.J., assignor to Radio Corporation of America, a corporation of Delaware Filed Nov. 10, 1966, Ser. No. 593,510
U.S. Cl. 330—19 18 Claims
Int. Cl. H03f 3/42

ABSTRACT OF THE DISCLOSURE

Automatic gain control apparatus for signal receiving systems which does not upset the operating point stability of direct coupled integrated circuit amplifiers included as a part thereof includes a circuit for providing automatic gain control action to a first stage of a multi-stage direct coupled amplifier and for off-setting at a second stage the changes in direct current flowing through a load included therein brought about by the gain control action, the off-set being in such a manner as to additionally provide automatic gain control to the second amplifier stage.

Figure 1:
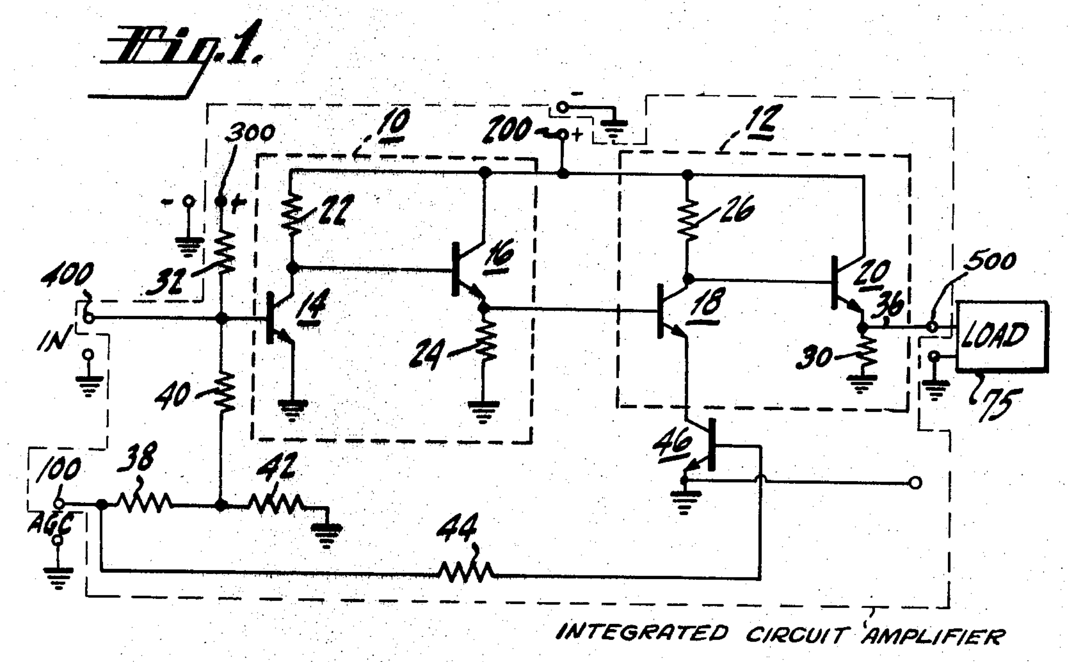

This invention relates to signal control apparatus, in general, and to automatic gain control arrangements for integrated circuits, in particular.

As used herein, the term integrated circuit refers to a unitary or monolithic semiconductor device or chip which is the equivalent of a network of interconnected active and passive circuit elements. Various problems have presented themselves in the design of such a semiconductor device. One problem, that of cascading resistance-capacitance coupled amplifiers, stems from the fact that an integrated circuit capacitor occupied a considerable area of the semiconductor chip, even for a relatively small amount of capacitance. Since the physical dimensions of the chip are limited, the size of the capacitor, and hence the amount of capacitance available for interstate coupling, must also be limited. Restricting the size of the capacitor, however, limits not only the low frequency response of the amplifier, but the high frequency response as well, and, therefore, the gain at the desired signal frequency; and because of the parasitic shunt capacitance existing across the integrated circuit capacitor structure, the high frequency response of the amplifier will be limited still further. With the limitations in the processing techniques presently used for fabricating integrated circuit capacitors, these size restrictions may be a substantial source of trouble due to shorting between the plates of the capacitor. Consequently, it would be desirable to eliminate the capacitors, and to direct current (D.C.) couple amplifier stages in integrated circuit design wherever possible.

The cascading of D.C. coupled amplifier stages, however, offers problems of its own. For example, since the D.C. voltage appearing at the output electrode of one stage comprises the input voltage for the next succeeding stage, complicated biasing networks are needed to establish the desired operating points for each of the cascaded stages. D.C. feedback is generally necessary to maintain each operating point stable, and where substantial gain is to be effected in a single integrated circuit device, the phase shifts within the D.C. feedback loop are such as to increase the likelihood of circuit instability. Before D.C. coupled amplifier stages can be cascaded effectively in signal receiving systems employing automatic gain control apparatus, in addition, provision must be made to prevent the automatic gain control action from affecting the operating point of any stage but the one whose gain is to be controlled. Otherwise, instability of amplifier operation may result which, if the gain is sufficiently high, can ultimately render the amplifier totally inoperative.

Automatic gain control, as commonly employed in present day signal receiving systems, is effected by applying the control signal to the input stage of a multi-stage amplifier. Such arrangements, however, often prove inadequate in circuit applications where large input signals are concerned. This is because the control action afforded operates to limit the magnitude of input signals the amplifier can effectively accept and because at certain levels sufficent signal feedthrough will result to overdrive succeeding stages and cause distortion. Although these difficulties exist as well with A.C. coupled amplifier stages, they are particularly acute where the stages are D.C. coupled. Consequently, it would also be desirable to provide automatic gain control action at amplifier stages in addition to the first, while, at the same time, maintaining the operating point stability outlined above.

It is an object of the present invention, therefore, to provide improved automatic gain control apparatus for signal receiving systems and, more particularly, apparatus which does not upset the operating point stability of D.C. coupled integrated circuit amplifiers included as a part thereof, while affording gain control action at more than one such amplifier stage.

As will become clear hereinafter, such apparatus includes a circuit for providing automatic gain control action to a first stage of a multi-stage D.C. amplifier and for off-setting at a second stage the changes in direct current flowing through a load included therein brought about by the gain control action, the offset being in such a manner as to additionally provide automatic gain control to the second amplifier stage.

For a better understanding of the present invention, together with further objects thereof, reference is had to the following description, taken in connection with the accompanying drawings, and its scope will be pointed out in the appended claims.

Figure 2:
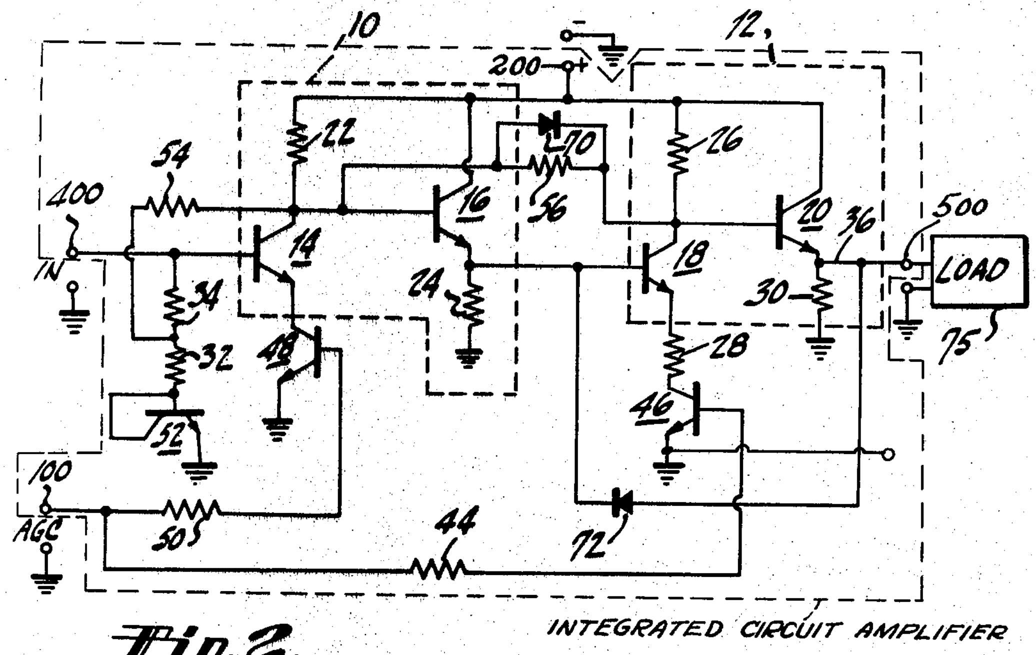

In the drawings:

FIGURE 1 is a schematic circuit diagram of a two-stage D.C. amplifier embodying the present invention; and FIGURE 2 is a schematic circuit diagram of a modification of the D.C. amplifier of FIGURE 1.

Referring now to FIGURE 1, the arrangement there shown includes a pair of D.C. coupled amplifier stages 10 and 12, the gains of which are to be automatically adjusted in response to a control signal applied to an input terminal 100. The two-stage amplifier may represent the intermediate frequency amplifier of a radio signal receiver, for example, with the automatic gain control signal being developed in response to variations in signal intensity.

Four transistors 14, 16, 18 and 20 are included in the amplifier of FIGURE 1. One transistor 14 is arranged in a common emitter configuration, with its collector electrode connected to an energizing potential terminal 200 through a resistor 22 and with its emitter electrode connected to a point of reference potential, such as ground. A second transistor 16 is arranged in a common collector configuration, with its collector electrode connected to the potential terminal 200 and with its emitter electrode connected to ground through a resistor 24. A third transistor 18 is also arranged in a common emitter configuration, with its collector electrode connected to the energizing terminal 200 by means of a resistor 26 and with its its emitter electrode connected to ground via an impedance path to be described hereinafter. The fourth transistor 20 is also arranged in a common collector configuration, with its collector electrode connected to the terminal 200 and with its emitter electrode connected by means of a resistor 30 to the reference ground point.

The base electrode of transistor 14 is connected to an energizing or bias potential terminal 300 through a resistor 32 and also, to the signal input terminal 400. The collector electrode of transistor 14 is also connected to the base electrode of transistor 16, the emitter electrode of which is connected to the base electrode of transistor 18. The collector electrode of transistor 18 is additionally connected to the base electrode of transistor 20, with that transistor's emitter electrode being connected via a conductor 36 to an output terminal 500 to which an appropriate load 75 may be connected. Load 75 may include one or more additional amplifier stages similar to that represented by the numeral 10, for example.

The D.C. amplifier circuit so described essentially comprises a first common emitter, common collector amplifier driving a second such amplifier. That is, with proper polarity potential sources connected between terminals 200 and ground, and 300 and ground, signals supplied to input terminals 400 are amplified first by the combination of transistors 14 and 16 and then by the combination of transistors 18 and 20. Amplified signals are thus developed across the resistor 30 and appear as such at the output terminal 500. Under zero signal conditions, a D.C. voltage appears at the output terminal 500 which is essentially equal to the quiescent operating voltage at the collector electrode of transistor 18 less the $V_{be}$ voltage drop of transistor 20. As used herein, the term $V_{be}$ voltage represents the average base-to-emitter voltage of a transistor which is operating as the active device in an amplifier circuit or the like. For silicon transistors, this $V_{be}$ voltage is approximately 0.7 volt, which is within the range for class A amplification.

A D.C. control voltage or, more particularly, an automatic gain control (AGC) signal is applied to terminal 100 in the arrangement of FIGURE 1 to maintain the amplified signals developed at output terminal 500 within a narrow intensity range for a wide range of signal intensities at the input terminal 400. This AGC signal may be supplied from any type source which develops a D.C. signal in response to received signal intensities beyond a predetermined amplitude value. As shown in FIGURE 1, the AGC signal is coupled trrough series resistors 38 and 40 to the base electrode of transistor 14. A further resistor 42 is connected between the junction of these resistors and ground to form an AGC signal divider with resistor 38.

As is well known, the gain of a common emitter amplifier stage, such as that including transistor 14 in FIGURE 1, can be adjusted by varying the transconductance of the transistor. Consider, for example, the case where the gain of the stage is to be reduced in response to increases in the received signal intensity above a predetermined amplitude value. It will be assumed that in such an instance the AGC signal supplied to terminal 100 decreases in value (goes more negative). Thus, the AGC signal decreases the bias voltage applied to the base electrode of transistor 14, decreases the quiescent current flow through transistor 14, and decreases the voltage drop across resistor 22. With transistor 14 initially biased at an operating point such that a decrease in its quiescent current reduces its transconductance, it will be noted that the effect of the AGC action is to decrease the gain of the first common emitter stage, as desired.

It will also be noted that such AGC action increases the voltage applied to the base electrode of transistor 16, the quiescent current flow through that transistor, the voltage drop across resistor 24, and the voltage applied to the base electrode of transistor 18. Thus, if the emitter electrode of transistor 18 is held at a fixed voltage, besides reducing the gain of the first common emitter stage, the AGC signal applied to terminal 100 will have the effect of changing the bias voltage on that transistor. The result will be an upset in the operating point stability of the second common emitter stage and a consequent increase in the quiescent current flow through transistor 18. If the change in bias voltage is sufficiently great, the resulting increase in current can saturate that transistor and thereby render the stage ineffective to translate the signal applied to the input terminal 400.

In order to maintain the stability of operation of this second common emitter stage, the D.C. coupled amplifier of FIGURE 1 also includes a control circuit for offsetting the effect of the changes in the bias voltage at the base electrode of transistor 18 brought about by the AGC action. More particularly, this circuit includes a resistor 44 connected at one end to the AGC terminal 100 and at the other to the base electrode of an amplifying transistor 46 included in the emitter circuit of transistor 18. As shown in FIGURE 1, the collector electrode of transistor 46 is connected to the emitter electrode of transistor 18 while the emitter electrode of transistor 46 is connected to ground. It will be noted that the resistors, the transistors and the interconnections of FIGURE 1 can easily be fabricated on an integrated circuit chip.

Referring once again to the multi-stage amplifier arrangement of FIGURE 1, the AGC signal supplied to terminal 100, and coupled to the base electrode of transistor 14 to reduce the gain of amplifier stage 10, is also coupled to the base electrode of transistor 46. In response to an increase in signal level, this AGC signal decreases the bias voltage applied to the base electrode, and tends to decrease the quiescent current flow through transistor 46, transistor 18, and resistor 26. Since the quiescent current of transistor 18 also flows through resistor 26, and increases in response to the AGC signal, the inclusion of the control circuit in the arrangement of FIGURE 1 thus acts in a direction to stabilize the current flow through resistor 26. With AGC signal divider resistors 38 and 42 of suitable value, for example, these opposing responses can be made to cancel so that the total current flow through resistor 26 remains substantially unchanged. As a result, the voltage drop across resistor 26, the voltage drop across resistor 30, and the quiescent voltage developed at the output terminal 500 are each maintained constant. The output voltage at terminal 500 can then be used to aid in biasing succeeding amplifier stages so as to make possible the direct coupling of several such signal translating units. The transfer characterisitcs of transistors 14, 16 and 46 can also be matched to stabilize the current flow through resistor 26 over a range of AGC signal magnitudes.

As is clear from FIGURE 1, the amplification of the signal voltage by transistor 18 is dependent upon the signal degeneration in the emitter electrode circuit of that transistor. More particularly, the greater the degeneration, the less the signal will be amplified and vice versa. This degeneration, in turn, is dependent upon the effective resistance presented by transistor 46 at its collector electrode, which is controlled by varying the AGC voltage at the base electrode of transistor 46. For maximum signal amplification, the circuit parameters are such that the saturation resistance of transistor 46 appears between the emitter of transistor 18 and ground. Since the saturation resistance of transistor 46 is relatively low, the amplification provided by transistor 18 is maximum. As the AGC voltage becomes more negative, the collector resistance of transistor 46 increases, increasing the degeneration and reducing the amplification of the amplifier stage 12. As a result, in addition to operating to stabilize the second common emitter stage by maintaining constant current flow through resistor 26, therefore, the control circuit of FIGURE 1 is also effective in providing automatic gain control of that stage.

By thus providing automatic gain control to each amplifier stage, and to each stage of a multi-stage arrangement in general in a similar manner, the signal handling capability of the amplifier of FIGURE 1 is improved over what it would otherwise be. This follows since the additional control is applied to the later stage where the possibility of saturation would normally be far greater due to its being called upon to handle an already amplified D.C. signal. Were this additional control feature omitted, the increased possibility of this saturation would then appreciably limit the magnitude of the input signal the amplifier of FIGURE 1 could effectively manage.

Referring now to FIGURE 2, the D.C. coupled amplifier arrangement there shown is a modification of that of FIGURE 1 with corresponding elements being similarly designated. The amplifier of FIGURE 2 is generally similar to that of FIGURE 1 in that transistor 46 operates to stabilize the quiescent current flowing through resistor 26 and to provide automatic gain control to transistor 18. It differs, however, in that the collector electrode of transistor 46 is connected to emitter electrode of transistor 18 through a resistor 28, rather than directly as in FIGURE 1. It also differs in that signal degeneration is also employed in the emitter circuit of transistor 14 to control the gain of the first common emitter stage. More particularly, instead of being grounded as in FIGURE 1, the emitter electrode of transistor 14 is connected to the collector electrode of an additional amplifying transistor 48. The emitter electrode of that transistor is connected to the ground reference point, as shown, while its base electrode is connected to one end of a resistor 50, the other end of which is connected to the AGC terminal 100. With transistor 48 then biased at an operating point such that a decrease (more negative) in the AGC voltage applied to its base electrode decreases its transconductance, the effective resistance at the emitter electrode of transistor 14 increases as the received signal strength increases. As with the combination of transistors 18 and 46, this results in an increased emitter signal degeneration, a decrease in the signal actually amplified by transistor 14, and a consequent reduction in gain. By suitable choice of resistor 28, the current flow through resistor 26 can once again be maintained constant.

The multi-stage amplifier of FIGURE 2 also differs from that of FIGURE 1 by using the forward voltage drop across a diode to provide a temperature compensated bias potential for the transistor 14, which is otherwise provided at terminal 300 in FIGURE 1. More particularly, the collector and base electrodes of a transistor 52 are connected together in FIGURE 2 and to the end of resistor 32 remote from an additional resistor 34, the other end of which is connected to the base electrode of transistor 14. As shown, the emitter electrode of transistor 52 is connected to ground. With transistor 52 thus connected as a diode, a bias potential essentially equal to the 0.7 volt $V_{be}$ voltage drop of transistor 52 is established. This biasing arrangement has been used in three integrated amplifier arrangements, as listed in the table below.

| Item | Units | Amplifier | | |
|---|---|---|---|---|
| | | 33 mw. Power Dissipation | 12 mw. Power Dissipation | 3 mw. Power Dissipation |
| Resistor 22 | Ohms | 1.8K | 3.4K | 12K |
| Resistor 24 | Ohms | 1.0K | 3.9K | 12K |
| Resistor 26 | Ohms | 3.0K | 7.5K | 27K |
| Resistor 28 | Ohms | 150 | 750 | 2.5K |
| Resistor 30 | Ohms | 2.2K | 3.9K | 12K |
| Resistor 32 | Ohms | 1.5K | 3.9K | 12K |
| Resistor 34 | Ohms | 1.5K | 3.9K | 12K |
| Resistor 44 | Ohms | 5K | 5K | 5K |
| Resistor 50 | Ohms | 5K | 5K | 5K |

It will be apparent, however, that two or more transistors could be arranged in this manner and serially connected to provide multiple 0.7 voltage bias potentials for other amplifier component values.

Two feedback resistors 54 and 56 are also included in the D.C. amplifier of FIGURE 2. One resistor 54 is connected between the collector electrode of transistor 14 and the junction of resistors 32 and 34 to stabilize the operation of the amplifier in the presence of temperature and supply voltage variations. In a non-integrated amplifier alternative, on the other hand, resistors 32 and 34 could be combined into a single unit with resistor 54 then being connected to an intermediate tap thereon. For the 33 mw., 12 mw., and 3 mw. power dissipation amplifiers tabulated above, resistor 54 may have a value equal to 5.6 kilohms, 15 kilohms, and 33 kilohms, respectively.

The other feedback resistor 56 is connected, as shown, between the collector electrodes of transistors 14 and 18. This resistor operates to maintain constant current flow through resistor 26, by causing the voltage at the base electrode of transistor 18 to oppose any voltage variations at the collector electrode thereof. In addition, it enables the bandwidth of the amplifier to be exchanged for gain. For example, approximately 30 db of gain with a 65 mc. bandwidth is obtainable with resistor 56 equal to 470 ohms, while a 50 db gain and 20 mc. bandwidth can be had with that resistor equal to 4.7 kilohms.

In an alternative arrangement, a diode 70 may be connected between the collector electrodes of transistors 14 and 18 in addition to the resistor 56 shown in FIGURE 2. When poled with its anode electrode connected to the transistor 14 and its cathode electrode connected to the transistor 18, this diode operates to limit the amplification of negative going signals applied to the input terminal 400. Another diode 72, with its anode electrode connected to the emitter electrode of transistor 20 and with its cathode electrode connected to the emitter electrode of transistor 16, may also be included in the arrangement of FIGURE 2 to limit positive going input signals. With this diode combination as part of the amplifier, and with the component values perviously set forth, successful operation has been obtained with input signal amplitudes up to 3 volts RMS.

As was previously mentioned, the D.C. amplifier configurations of FIGURES 1 and 2 are each suitable for construction in integrated circuit form. (The manner of implementing the various transistor, diode and resistor functional portions in such arrangements is known in the art, one such method, for example, being illustrated by Patent No. 3,271,685, issued Sept. 6, 1966.) In a particular integrated circuit construction exhibiting excellent operational characteristics, all the elemental components for the amplifier of FIGURE 2 except resistor 56 were disposed within a single wafer of semiconductor material. This resistor was externally connected to the circuit to permit the selection of its particular value in order to exchange amplifier bandwidth for gain as desired, as discussed above.

A plurality of contacts arranged along the periphery of the resulting integrated circuit chip served as the various input, output and potential terminals therefor. One contact, connected to the base electrode of transistor 14, served as the signal input terminal 400. A second contact, connected to the junction of resistors 44 and 50, was used as the AGC terminal 100. Third and fourth contacts, respectively connected to the collector electrodes of transistors 14 and 18, served as the terminals for the connection of the external resistor 56. A fifth contact, connected to the emitter electrode of transistor 20, was used as the signal output terminal 500. A sixth contact, connected to the emitter electrode of transistor 48 provided a common ground terminal for the amplifier while a seventh contact, connected to the collector electrode of transistor 16, served as the potential supply terminal 200.

Eighth and ninth contacts respectively connected the anode and cathode electrodes of the negative going signal limiting diode 70 and made them available for external connection to the collector electrodes of transistors 14 and 18 via the third and fourth contacts. A tenth contact connected the anode electrode of the positive going signal limiting diode 72 and made it available for external connection to the emitter electrode of transistor 20 via the fifth contact. Eleventh and twelfth contacts respectively connected the collector electrodes of transistors 46 and 48 and served as terminals for additional external connections. With bypass capacitors connected to these last two contacts and with a fixed voltage connected to the second contact, for example, the amplifier is useful in mixer applications.

What is claimed is:

1. A signal translating circuit comprising:
first and second amplifier stages, each having an input terminal and an output terminal;
a third amplifier stage having a pair of input terminals and a load;
means for direct current coupling the output terminal of said first stage to one input termianl of said third stage;
means for direct current coupling the output terminal of said second stage to the other input terminal of said third stage;
a source of gain control signals;
means for coupling said signals to the input terminals of said first and second stages;
and means for proportioning the direct current signals developed by said first and second stages and applied to the input terminals of said third stage to cause the direct current flowing through said load to vary in a substantially equal and opposite sense in response to changes in the direct current output signal from said first amplifier stage due to variations in said gain control signal, and in response to changes in the direct current output signal from said second amplifier stage due to said gain control signal variations.

2. A signal translating circuit comprising:
first, second, and third transistors, each having an emitter electrode, a base electrode, and a collector electrode;
first and second terminals adapted to be connected to a source of energizing potential and to a source of bias potential respectively;
a first resistor connected between the collector electrode of said first transistor and said first terminal;
a second resistor connected between the collector electrode of said second transistor and said first terminal;
a third resistor connected between the base electrode of said first transistor and said second terminal;
a direct current connection from the collector electrode of said third transistor to the emitter electrode of said second transistor;
direct current connections from the emitter electrodes of said first and third transistors to a point of reference potential;
means for direct current coupling the collector electrode of said first transistor to the base electrode of said second transistor;
means for supplying signals to be amplified to the base electrode of said first transistor;
and means for supplying automatic gain control signals to the base electrodes of said first and third transistors;
said first and third transistors and the magnitude of the gain control signals applied to the base electrodes thereof being so selectively that the changes in direct current flowing from said second transistor through said second resistor due to variations in the control signal applied to said first transistor are substantially equal in magnitude and opposite in direction to the changes in said current due to variations in the gain control signal applied to said third transistor.

3. A signal translating circuit as defined in claim 2 wherein said direct current coupling means includes a fourth transistor having a collector electrode direct current coupled to said first terminal, a base electrode direct current coupled to the collector electrode of said first transistor, and an emitter electrode direct current coupled to said point of reference potential by means of a fourth resistor and to the base electrode of said second transistor.

4. A signal translating circuit comprising:
first, second, third, and fourth transistors, each having an emitter electrode, a base electrode, and a collector electrode;
first and second terminals adapted to be connected to a source of energizing potential and to a source of bias potential respectively;
a first resistor connected between the collector electrode of said first transistor and said first terminal;
a second resistor connected between the collector electrode of said second transistor and said first terminal;
a third resistor connected between the base electrode of said first transistor and said second terminal;
a fourth resistor connected from the collector electrode of said third transistor to the emitter of said second transistor;
a direct current connection from the collector electrode of said fourth transistor to the emitter electrode of said first transistor;
direct current connections from the emitter electrodes of said third and fourth transistors to a point of reference potential;
means for direct current coupling the collector electrode of said first transistor to the base electrode of said second transistor;
means for supplying signals to be amplified to the base electrode of said first transistor;
and means for supplying automatic gain control signals to the base electrodes of said third and fourth transistors;
said first, third, and fourth transistors and said fourth resistor being so selected that the changes in direct current flowing from said second transistor through said second resistor due to variations in the gain control signal applied to said third transistor are substantially equal in magnitude and opposite in direction to the changes in said current due to variations in the gain control signal applied to said fourth transistor.

5. A signal translating circuit as defined in claim 4 wherein said direct current coupling means includes a fifth transistor having a collector electrode direct current coupled to said first terminal, a base electrode direct current coupled to the collector electrode of said first transistor, and an emitter electrode direct current coupled to said point of reference potential by means of a fifth resistor and to the base electrode of said second transistor.

6. A signal translating circuit as defined in claim 4 wherein there is also included a fifth resistor connected between the collector electrode of said first transistor and an intermediate point on said third resistor.

7. A signal translating circuit as defined in claim 4 wherein there is also included a fifth resistor connected between the collector electrode of said second transistor and the collector electrode of said first transistor.

8. A signal translating circuit as defined in claim 5 wherein there is also included a sixth transistor having a collector electrode direct current coupled to said first terminal, a base electrode direct current coupled to the collector electrode of said second transistor, and an emitter electrode direct current coupled to said point of reference potential by means of a sixth resistor and to an output terminal for said circuit.

9. A signal translating circuit as defined in claim 8 wherein there is also included first and second diodes, with the anode and cathode electrodes of said first diode being respectively connected to the collector electrodes of said first and second transistors, and with the anode and cathode electrodes of said second diode being respectively connected to the emitter electrodes of said sixth and fifth transistors.

10. In an integrated circuit amplifier configuration of the type including a two-stage direct current coupled amplifier having an output circuit through which a direct current flows, apparatus comprising:

first and second current stabilizing stages incorporated as part of said integrated circuit amplifier configurations and associated with one of said two amplifier stages and with the other of said two amplifier stages; respectively;

a source of gain control signals;

and means including said first and second stabilizing stages for individually coupling predetermined portions of said signals to their respectively associated amplifier stages to control the signal gains thereof and to offset any changes in direct current flowing through said load circuit in response to variations in the gain control signal coupled to said one amplifier stage with substantially equal and opposite changes in direct current flowing through said load circuit in response to variations in the gain control signal coupled to said other amplifier stage.

11. In an integrated circuit amplifier configuration of the type including: (a) an input transistor having a collector electrode connected by means of a resistor to an energizing potential terminal, a base electrode connected to a source of input signals to be amplified, and an emitter electrode; (b) an intermediate transistor having a collector electrode directly connected to said potential terminal, a base electrode directly connected to the collector electrode of said first transistor, and an emitter electrode connected by means of a resistor to a point of reference potential; and (c) an output transistor having a collector electrode connected by means of a load resistor to said potential terminal, a base electrode directly connected to the emitter electrode of said second transistor, and an emitter electrode, apparatus comprising:

first and second transistors incorporated as part of said integrated circuit amplifier configuration, each having a collector electrode, a base electrode, and an emitter electrode;

a direct current connection from the collector electrode of said first transistor to the emitter electrode of said input transistor;

a first resistor connected between the collector electrode of said second transistor and the emitter electrode of said output transistor;

direct current connections from the emitter electrodes of said first and second transistors to said point of reference potential;

second and third resistors serially connected between the base electrode of said input transistor and a source of bias potential;

a fourth resistor connected between the collector electrode of said input transistor and the junction point of said second and third resistors;

a fifth resistor connected between the collector electrode of said output transistor and the collector electrode of said input transistor;

a source of gain control signals;

and means for direct current coupling said gain control signals to the base electrodes of said first and second transistors;

said first and second transistors and said first, second, third, fourth and fifth resistors being so selected that the changes in direct current flowing from said output transistor through said load resistor due to variations in the gain control signal applied to said first transistor are substantially equal in magnitude and opposite in direction to the changes in said current due to variations in the gain control signal applied to said second transistor.

12. In an integrated circuit amplifier configuration of the type described in claim 11, apparatus as defined in said claim wherein said bias potential source includes a third transistor having a collector electrode, a base electrode directly connected to said collector electrode and to the end of said third resistor remote from said second resistor, and an emitter electrode directly connected to said point of reference potential.

13. In a signal translating system of the type including a multi-stage direct current coupled amplifier having an output load through which a direct current flows, apparatus comprising:

a source of gain control signals;

a plurality of current stabilizing circuits equal in number to, and respectively associated with, said multiple number of amplifier stages for coupling said gain control signals to said stages;

and means including individual ones of said plurality of stabilizing circuits for proportioning the direct current signals developed by each of their respectively associated amplifier stages and coupled to the next succeeding stage to offset any changes in direct current flowing through said load in response to variations in the gain control signal coupled to the first of said amplifier stages with opposite changes in direct current flowing through said load in response to variations in the gain control signals coupled to the others of said amplifier stages.

14. An electrical circuit comprising:

a plurality of transistor amplifier stages direct coupled in cascade relation;

means providing a source of gain controlling voltage coupled to a first of said amplifier stages, changes in said gain controlling voltage tending to change the current through said first amplifier stage and through succeeding cascaded amplifier stages;

voltage responsive impedance means connected to receive the current through a succeeding one of said amplifier stages; and means for coupling said source of gain controlling voltage to said voltage responsive impedance means to cause said impedance means to vary in a direction to counteract changes of current through said succeeding one of said amplifier stages.

15. An electrical circuit as defined in claim 14 wherein said voltage responsive impedance means includes a transistor having an electrode connected to receive said gain controlling voltage and a current path for receiving the current of said one succeeding amplifier stage.

16. An electrical circuit comprising:

a plurality of transistor amplifier stages direct coupled in cascade relation;

means providing a source of gain controlling voltage coupled to a first of said amplifier stages, changes in said gain controlling voltage tending to change the current through said first amplifier stage in a first direction and through a succeeding cascaded amplifier stage in an opposite direction;

first voltage responsive impedance means connected to receive the current through said succeeding amplifier stage; and means for coupling said source of gain controlling voltage to said voltage responsive impedance means to cause said impedance means to vary in a direction to cause the change in current through said succeeding stage to be substantially equal to the change in current through said first stage.

17. An electrical circuit as defined in claim 16 wherein said first amplifier stage includes a second voltage responsive impedance means connected to receive the current through said first stage and to which is coupled said source of gain controlling voltage.

18. An electrical circuit as defined in claim 17 wherein said first and second voltage responsive impedance means each include a transistor having an electrods connected to receive said gain controlling voltage and a current path for receiving the current of said succeeding amplifier stage and said first amplifier stage respectively.

References Cited

UNITED STATES PATENTS

| | | | |
|---|---|---|---|
| 3,141,137 | 7/1964 | Greutman | 330—29 |
| 3,210,683 | 10/1965 | Pay. | |

JOHN KOMINSKI, *Primary Examiner.*

J. B. MULLINS, *Assistant Examiner.*

U.S. Cl. X.R.

330—29, 133, 145